United States Patent [19]

Lim et al.

[11] Patent Number: 5,184,233
[45] Date of Patent: Feb. 2, 1993

[54] LIQUID CRYSTAL-BASED COMPOSITE MATERIAL INCLUDING ELECTRICALLY CONDUCTING ELONGATED PARTICLES AND HAVING ENHANCED MICROWAVE BIREFRINGENCE

[75] Inventors: Khoon C. Lim, Agoura; J. David Margerum, Woodland Hills; Anna M. Lackner, Los Angeles; Leroy J. Miller, Canoga Park, all of Calif.

[73] Assignee: Hughes Aircraft Company, Los Angeles, Calif.

[21] Appl. No.: 863,501

[22] Filed: Mar. 30, 1992

Related U.S. Application Data

[63] Continuation of Ser. No. 573,503, Aug. 24, 1990, abandoned.

[51] Int. Cl.$^5$ .......................... G02F 1/137; G02F 1/13
[52] U.S. Cl. .................................. 359/46; 359/84; 359/94; 359/103
[58] Field of Search ........... 350/347 V, 350 R, 331 R; 359/46, 84, 94, 103

[56] References Cited

U.S. PATENT DOCUMENTS

| | | | |
|---|---|---|---|
| 3,631,501 | 12/1971 | Buscher | 333/31 A |
| 3,701,058 | 10/1972 | Smith | 333/31 A |
| 3,805,197 | 4/1974 | Buscher | 333/31 A |
| 4,435,047 | 3/1984 | Fergason | 350/334 |
| 4,613,869 | 9/1986 | Ajioka et al. | 343/768 |
| 4,666,253 | 5/1987 | Yoshida | 350/334 |
| 4,668,415 | 5/1987 | Luise | 350/350 R |
| 4,688,900 | 8/1987 | Doane et al. | 350/347 V |
| 4,701,024 | 10/1987 | Kobayashi et al. | 350/350 R |
| 4,877,501 | 10/1989 | Schnur et al. | 204/157.64 |
| 4,911,981 | 3/1990 | Schnur et al. | 428/402.24 |
| 4,946,623 | 8/1990 | Tabony | 350/350 R |
| 5,049,307 | 9/1991 | Tabony | 359/103 |

FOREIGN PATENT DOCUMENTS

1204281 11/1965 Fed. Rep. of Germany .
1352561 11/1987 U.S.S.R. .
1356048 11/1987 U.S.S.R. .

OTHER PUBLICATIONS

"Suspended Particle Display with Improved Properties", R. L. Saxe et al., 1982 IEEE, 1982 International Display Research Conference.
"Nonlinear Microwave Susceptibility Measurement of an Artificial Kerr Medium", Bradley Bobbs et al., Appl. Phys. Lett., vol. 52, No. 1, Jan. 4, 1988, pp. 4-6.
"Liquid Dielectric Phase Shifters", Final Report for Contract DAAK40-76-C-0516, S. Kaye et al.
"Electrically Controllable Liquid Artificial Dielectric Media", H. T. Buscher, 1979 IEEE.
"Electrooptical Characteristics of Dipole Suspensions", A. M. Marks, Applied Optics, Jul. 1969, vol. 8, No. 7, pp. 1397-1412.

*Primary Examiner*—Janice A. Howell
*Assistant Examiner*—Anita Pellman Gross
*Attorney, Agent, or Firm*—E. E. Leitereg; W. K. Denson-Low

[57] ABSTRACT

A composite material (20) has electrically conducting, elongated particles (22) dispersed in a liquid crystal (24). The index of refraction to microwaves is controllable by the application of a transverse electric field that aligns the liquid crystal material (24) and the particles (22). A phase modulating cell (31) is formed by placing the composite material (20) inside a microwave wave guide (32), with transverse electrodes (36) built into the sides of the wave guide (32). Another set of transverse electrodes or magnet pole pieces (30) can be provided to align the liquid crystal material (24) and the particles (22) in another direction, thereby switching the index of refraction of the cell (31). The particles (22) may be made of a ferromagnetic material, to permit magnetic as well as electrical switching.

19 Claims, 8 Drawing Sheets

LIQUID CRYSTAL-BASED COMPOSITE MATERIAL INCLUDING ELECTRICALLY CONDUCTING ELONGATED PARTICLES AND HAVING ENHANCED MICROWAVE BIREFRINGENCE

This invention was made with Government support under Contract No. N00014-87-C-2354 awarded by the Department of the Navy. The Government has certain rights in this invention.

This is a continuation of application Ser. No. 07/573,503, filed Aug. 24, 1990, now abandoned.

BACKGROUND OF THE INVENTION

This invention relates to microwave (including millimeter wave) devices, and, more particularly, to microwave phase modulation with a liquid crystal-based composite material.

The index of refraction of many media is fixed and essentially constant, but there are "birefringent" media where the index of refraction of the material varies with relative orientation of a polarized wave and the medium. The birefringence of a uniaxial crystal is manifested by double angular displacements of a wave that passes through the medium. For example, in many viewing angles calcite crystals are birefringent to visible light, so that two differently positioned images are often seen when an object is viewed through a calcite crystal.

The index of refraction of some birefringent materials and of Kerr-effect isotropic materials can be controllably varied directionally by the application of a magnetic or electrical field to the medium. For example, liquid crystals are known to be birefringent for visible light, and variable under the application of an electric field. This property has been used in liquid crystal light valves for use in color projection displays.

Although birefringent materials have been known and used for controlling visible light, there are many potential applications for such materials in other portions of the electromagnetic spectrum such as the microwave range. Although viable birefringent and Kerr-effect materials are known for use in the visible-light frequency range, until recent years there have been known few if any practical Kerr-effect materials for microwave radiation. The most promising reported Kerr-effect materials for use in the microwave range are suspensions of highly asymmetric metallic particles in organic liquids. The birefringence of these suspensions is typically about 0.08 or less.

Although such media having controllable indices of refraction to microwaves are known, there is a need for media with increased birefringence to control beams of microwave energy, in applications such as scanning array antennas. The greater the birefringence, the more readily a device can be made to achieve a preselected degree of beam control. Moreover, the cost of the medium and the control mechanism for many existing microwave modulators is so high that they cannot be used in applications that require large arrays or must be low cost to be commercially feasible. The present invention fulfills the need for an improved microwave-birefringent material which can be controlled with applied electric and magnetic fields, and further provides related advantages.

SUMMARY OF THE INVENTION

The present invention provides a composite material whose microwave birefrigence is equal to or greater than that of either of the components of the material. This material is readily fabricated and can be used in a variety of phase modulating applications where the index of refraction must be controllably varied by applied external fields. The composite material is utilized in devices and processes that require controllable phase modulation by changing the microwave index of refraction. These devices are in many cases more compact and less expensive than conventional device used for the same purposes.

In accordance with the invention, a microwave phase modulating cell comprises a microwave wave guide; a phase modulating medium disposed within the wave guide, the phase modulating medium comprising a liquid crystal having a dispersion of electrically conducting, elongated particles therein; and means for controllably aligning the particles and the liquid crystal in a first direction in the phase modulating medium.

The phase modulating medium within the microwave wave guide is a composite of electrically conducting, elongated particles dispersed within a liquid crystal. The means for controllably aligning is preferably a pair of transverse, oppositely disposed electrodes across which a voltage is applied. The applied voltage transverse to the wave propagation direction causes the elongated particles and the molecules of a positive dielectric anisotropy liquid crystal to align transverse to the wave propagation direction, achieving an index of refraction that is different from that of the randomly oriented particles and liquid crystal. Preferably, a second means controllable aligning is provided to realign the particles and the liquid crystals in another direction. The index of refraction of the cell is rapidly and controllably varied through the two means for controllably aligning. By selecting the controllably directions of alignment with regard to the polarization direction of the wave, the full birefringence capability of the cell can be utilized.

The present invention therefore provides a phase modulating medium with a high microwave birefringence, and a cell construction that can be tuned to modulate the microwave. Directional transmitters, receivers, and the like can be constructed without necessarily requiring moving parts, and at a fraction of the cost and size of equivalent prior devices. Other features and advantages of the invention will be apparent from the following more detailed description of the preferred embodiment, taken in conjunction with the accompanying drawings, which illustrate, by way of example, the principles of the invention.

DETAILED DESCRIPTION OF THE INVENTION

In accordance with the invention, a liquid crystal-based composite material comprises a liquid crystal having a dispersion of electrically conducting, elongated particles therein.

Figure 1:
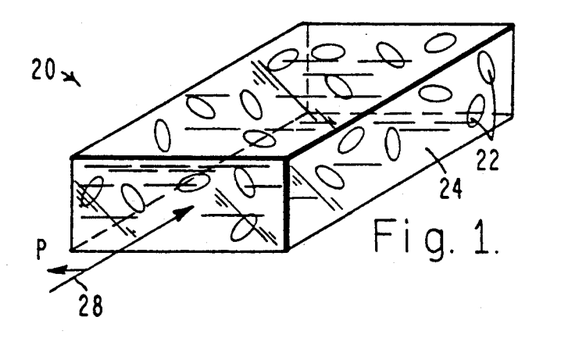
FIG. 1 is a schematic perspective drawing of a composite material having a distribution of elongated particles therein.

FIG. 1 depicts a composite material 20 formed from elongated, electrically conducting particles 22 dispersed throughout a liquid crystal 24. The elongated, rod-like particles may be any type of electrically conducting material, including but not limited to solid metals and metal-coated nonmetals. Metal-coated nonmetals such as metal coated organic microtubes (also sometimes called "microtubules") are preferred, because they have a density more nearly that of the liquid crystal and therefore are not as subject to gravity-driven segregation as are solid metals.

In a preferred form, the particles are nickel-coated hollow cylinders of lecithin macromolecules having an average length of about 10 micrometers, an average diameter of about 0.8 micrometers, and an external coating of nickel about 0.1 micrometer thick. A preferred concentration of the particles is at least about 0.2 volume percent of the composite material 20. The preparation of such particles is disclosed in U.S. Pat. No. 4,877,501 and U.S. Pat. No. 4,911,981, whose disclosures are incorporated by reference.

The liquid crystal can be any liquid crystal material whose molecules align under an applied magnetic or electrical field, including nematic, cholesteric, and smectic liquid crystals. The liquid crystal preferably has a positive dielectric anisotropy and a positive magnetic anisotropy. A preferred liquid crystal is ROTN-404, a nematic liquid crystal which is a mixture of cyanobiphenyls and cyanophenylpyrimidines, available commercially from Hoffmann-LaRoche. A preferred composite material is prepared by mixing the nickel-coated microtubes into the liquid crystal.

Figure 2:
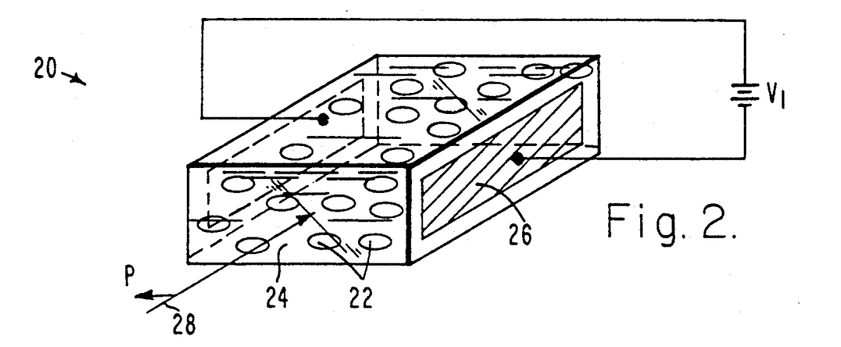
FIG. 2 is a schematic perspective drawing like that of FIG. 1, but with an electrical field applied in the indicated direction.

The elongated particles 22 and the molecules of the liquid crystal 24 are initially randomly oriented in the composite material 20, as illustrated in FIG. 1. In one approach to orienting the particles and the molecules of the liquid crystal, two opposing electrodes 26 are placed on either side of the composite material 20, as illustrated in FIG. 2. When a voltage $V_1$ is applied between the electrodes 26, the particles 22 and the molecules of the liquid crystal 24 align parallel to the field vector between the electrodes 26. The electrodes 26 are preferably placed so that when the voltage $V_1$ is applied there is an electric field formed that is transverse to a microwave wave propagation direction 28 of a microwave having a polarization vector P, so that the particles 22 and the molecules of the liquid crystal 24 align in a direction perpendicular to the propagation direction 28. This condition of alignment may be viewed as a first aligned state, to be distinguished from the randomly oriented state of FIG. 1.

When the voltage $V_1$ is discontinued, the particles 22 and the molecules of the liquid crystal tend to return to a randomly oriented state, but that return is typically rather slow and uncontrolled. To provide a more rapid, controllable change to a well-defined second state, a second means for aligning the particles and the molecules of the liquid crystal is provided. The second means could be another set of electrodes similar to that of FIG. 2, except oriented with the field vector between the electrodes at a different angle to the microwave polarization direction P.

Figure 3:
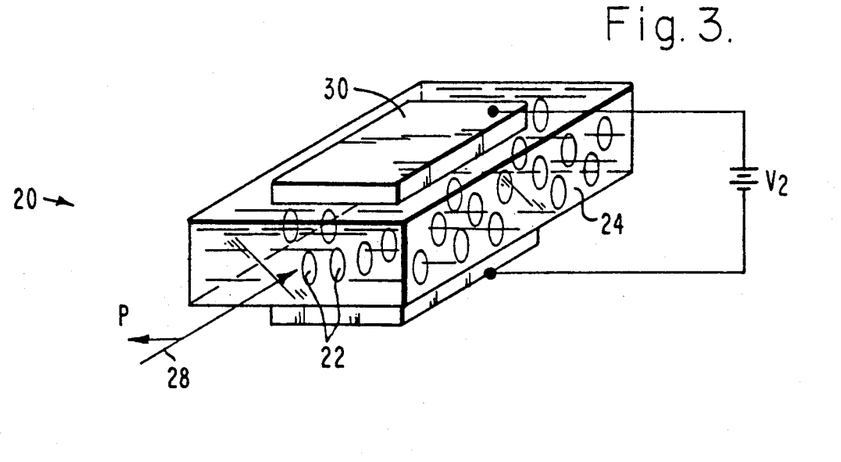
FIG. 3 is a schematic perspective drawing like that of FIG. 2, but with a magnetic field applied in a second indicated direction.

FIG. 3 illustrates an alternative approach to the second means for aligning the particles and the liquid crystal, which is preferred for use when the particles are nickel-coated microtubes or the particles are otherwise responsive to a magnetic field. A set of opposing magnet or electromagnet pole pieces 30 are placed on either side of the composite material 20, preferably such that the vector between the pole pieces 30 is perpendicular to the propagation direction 28 and also perpendicular to the vector between the electrodes 26. (The electrodes 26 are not shown in FIG. 3 for clarity of illustration, but normally both the electrodes 26 and the pole pieces 30 would be present, as will be discussed for the structure of FIG. 4.) The nickel metal of the microtube particles is ferromagnetic, and aligns with the magnetic field produced by the pole pieces when a voltage $V_2$ is applied to the windings of the pole pieces. The molecules of the liquid crystal also align with the magnetic field, so that both the particles and the liquid crystal molecules realign to the second state parallel to the vector between the pole pieces 30.

Thus, there are three limiting alignment conditions readily achieved with an apparatus that has both the opposing electrodes 26 and the opposing pole pieces 30. There is a random state, where there is no alignment. There is a first aligned state, with the particles and the molecules of the liquid crystal aligned parallel to the vector between the electrodes 26, and there is a second aligned state, with the particles and the molecules of the liquid crystal aligned parallel to the vector between the pole pieces 30. Since there is a relatively small restoring force tending to drive the particles and the liquid crystal molecules back to the random state, the degree of alignment in either the first or the second state can be controlled by the value of the applied voltage $V_1$ or $V_2$. The voltages $V_1$ and $V_2$ can be applied simultaneously, to achieve a degree of alignment in some other direction in the plane perpendicular to the direction of propagation 28.

Thus, in accordance with the invention, a method for modulating the phase of a microwave comprises the steps of providing a microwave phase modulating cell comprising a phase modulating medium, the phase modulating medium comprising a liquid crystal having a dispersion of electrically conducting, elongated particles therein, and means for controllably aligning the particles and the liquid crystal in a selected direction in the phase modulating medium; directing a beam of microwave energy through the cell in a microwave propagation direction; and operating the means for controllably aligning the particles and the liquid crystal, thereby changing the microwave index of refraction of the phase modulating medium. As discussed, the particles can also be ferromagnetic to react with a magnetic field.

Figure 4:
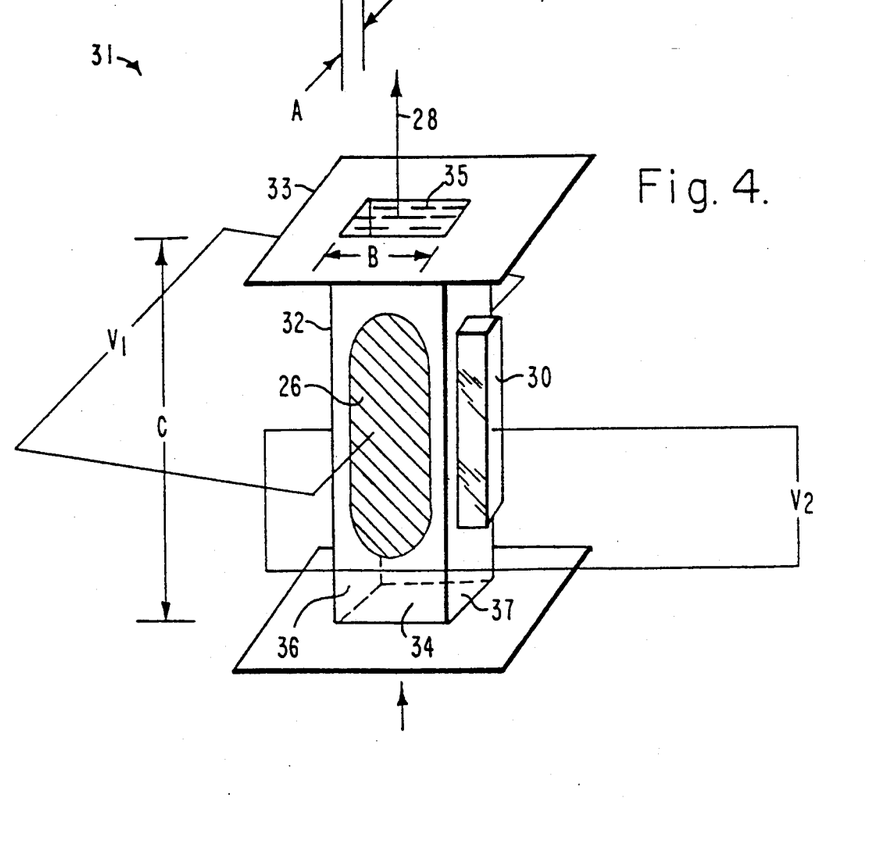
FIG. 4 is a perspective view of a phase modulating cell.

A modulating cell 31 is illustrated in FIG. 4. The cell 31 includes a microwave wave guide 32, which is a hollow metal tube, usually rectangular in cross section, that is dimensioned for the propagation of microwaves therein. As used herein, microwaves have wavelengths of from about 30 centimeters (1 GHz frequency) to about 3 centimeters (100 GHz frequency), and include the frequencies commonly termed microwaves and millimeter waves. Standard microwave wave guides with appropriate dimensions for the selected wavelength are available commercially. The wave guide 32 normally has a mounting flange 33 on each end thereof.

By way of illustration and not limitation, the waveguide 32 has dimensions indicated for use with 30 GHz microwaves. The height A of the wave guide 32 is about 0.35 centimeters, the width B is about 0.7 centimeters, and the length C is about 10 centimeters. Other dimensions, which are well known in the art, are used for other microwave frequencies.

An interior cavity 34 of the wave guide 32 is filled with the composite material of electrically conducting, elongated particles dispersed in a liquid crystal, as discussed previously. The ends of the cavity 34 are closed with polyester windows 35 about 0.3 millimeters thick.

Apertures are cut into two opposing faces 36 of the rectangular wave guide 32, and opposing electrodes 26 are mounted therein. Apertures are cut into the other two opposing faces 37 of the wave guide 32, and opposing electromagnet pole pieces 30 mounted therein. The electrodes 26 are connected to voltage source $V_1$, and the windings of the pole pieces 30 are connected to voltage source $V_2$, in the manner discussed previously.

A polarized microwave beam is directed through the wave guide 32, entering and leaving the wave guide 32 through the windows 35. The index of refraction of the composite medium within the wave guide 32, relative to the microwave beam, is controlled by adjusting the voltages $V_1$ and $V_2$. In one instance, voltage $V_2$ to the electromagnets is maintained zero and the voltage $V_1$ to the electrodes is increased to align the particles and the molecules of the liquid crystal perpendicular to the faces 36. After a period of time, $V_1$ is reduced to zero and $V_2$ is gradually increased to align the particles and the molecules of the liquid crystal perpendicular to the faces 37. The phase velocity of the microwave is altered as the voltages are changed, and the index of refraction of the medium within the phase modulating cell is also altered. Simultaneous application of the voltages $V_1$ and $V_2$ is used to achieve intermediate alignment directions.

Several phase modulating cells like that of FIG. 4 were constructed to evaluate the composite material of the invention. In some instances, the magnetic field was applied with a permanent magnet rather than an electromagnet. A composite material medium containing 0.2 percent by weight of the nickel-coated microtubes, which were about 0.8 micrometers in diameter with an average length of about 10 micrometers, in ROTN-404 liquid crystal was prepared and placed into each of the phase modulating cells. For comparison purposes, a similar series of tests was performed using only the ROTN-404 liquid crystal as the medium. For all of these tests, with and without particles in the liquid crystal, the microwave wave had a frequency of 30 GHz, and standard WR-28 wave guides were used. The maximum voltage applied between the electrodes 26, which were spaced 0.35 centimeters apart, was 300 volts. The maximum magnetic field was about 3 kilogauss. A standard Mach-Zehnder microwave phase bridge such as that shown in the publication "Nonlinear microwave susceptibility measurement of an artificial Kerr medium" by Bradley Bobbs et al., *Appl. Phys. Lett.*, vol. 52, no. 1, Jan. 4, 1988, at pages 4-6, was used for the measurements.

Figure 5:
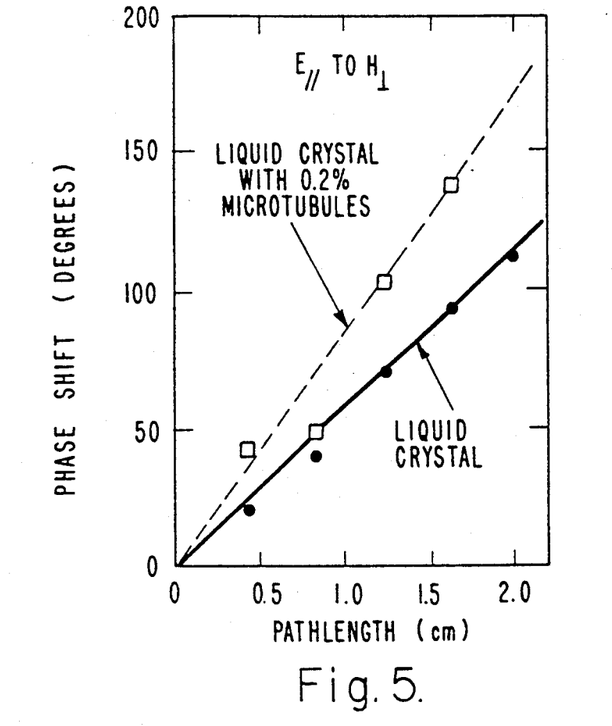
FIG. 5 is a graph of phase shift induced by switching between orthogonal electrical and magnetic fields, as a function of path length of liquid crystal and liquid crystal composite.

FIG. 5 depicts the phase shift of the microwave as a function of the path length, that is, the length of microwave travel through the composite medium. The upper line is for the composite material having electrically conducting, elongated particles in the liquid crystal, while the lower line is for the liquid crystal material only. The liquid crystal with a dispersion of elongated, electrically conducting particles achieves substantially increased phase shifting over the liquid crystal material. From these data, the birefringence of the composite material medium is about 0.22, and the birefringence of the liquid crystal material is about 0.152.

Figure 6:
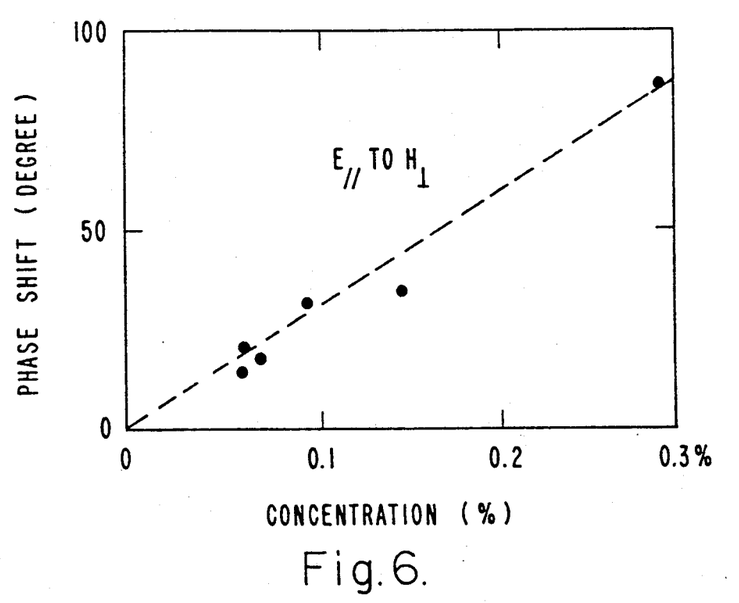
FIG. 6 is a graph of phase shift angle change induced by switching from orthogonal electrical and magnetic fields, as a function of the concentration of metallized microtubes in paraffin wax oil.

Another series of tests was performed with varying amounts of the nickel-coated microtubes suspended in an isotropic material, paraffin wax oil (which is not a liquid crystal). These measurements were conducted in the same type of waveguide as just discussed, with a path length of 3.9 centimeters. The results of the measurements are shown in FIG. 6. The paraffin wax oil is known to show zero birefringence, so any birefringence in these results is due to the small concentration of the microtubes. From these data, a birefringence of the nickel-coated microtubes at a concentration of 0.2 weight percent was estimated to be about 0.04.

The total of the birefringence of the liquid crystal material (0.152) plus the birefringence of the elongated particles (0.04) in an isotropic medium, which is the expected total birefringence for the composite material, is about 0.192. The actual measured birefringence for the composite material, from FIG. 5, is about 0.22. The measured birefringence is therefore about 15 percent greater than the predicted birefringence, a completely unexpected result.

Figure 7:
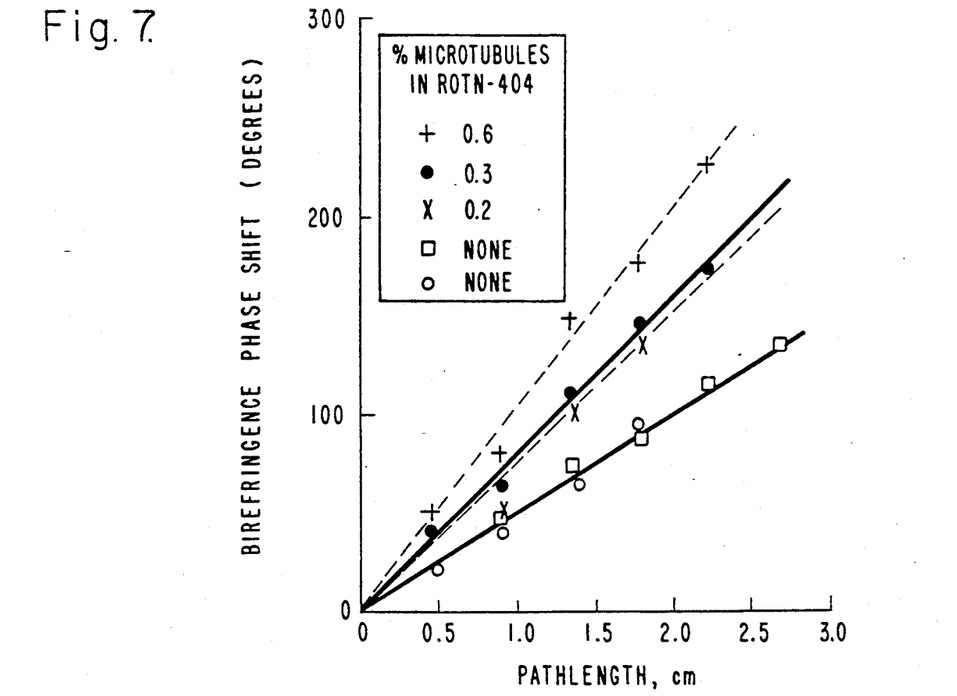
FIG. 7 is a graph of phase shift angle change induced by switching between orthogonal magnetic fields, as a function of path length of liquid crystal and liquid crystal composites having various concentrations of metallized microtubes.

Several phase modulating test cells were made similar to that of FIG. 4, except that the field alignment was applied just by a 3 kilogauss magnetic field from a permanent magnet which was rotated 90 degrees in position about the cell, and thence 90 degrees to the polarization vector of the 30 kHz microwave, which remained constant. The cells were filled with various pathlenghts of ROTN-404 liquid crystal containing 0, 0.2, 0.3, and 0.6 weight percent, respectively, of nickel-coated microtubes about 0.8 micrometers in diameter with an average length of about 10 micrometers. FIG. 7 shows the birefringence phase shift change measured from rotating the magnetic field from parallel to perpendicular to the microwave polarization direction in the waveguide cell. The birefringence of the liquid crystal determined from these measurements was 0.14, while the composites of microtubes in liquid crystal were in the 0.21 to 0.28 range. This birefringence of the composite is much higher than any values previously reported for the microwave birefringence of artificial dielectric suspensions of asymmetric metallic particles in isotropic fluids, which were only as high as 0.08.

Figure 8:
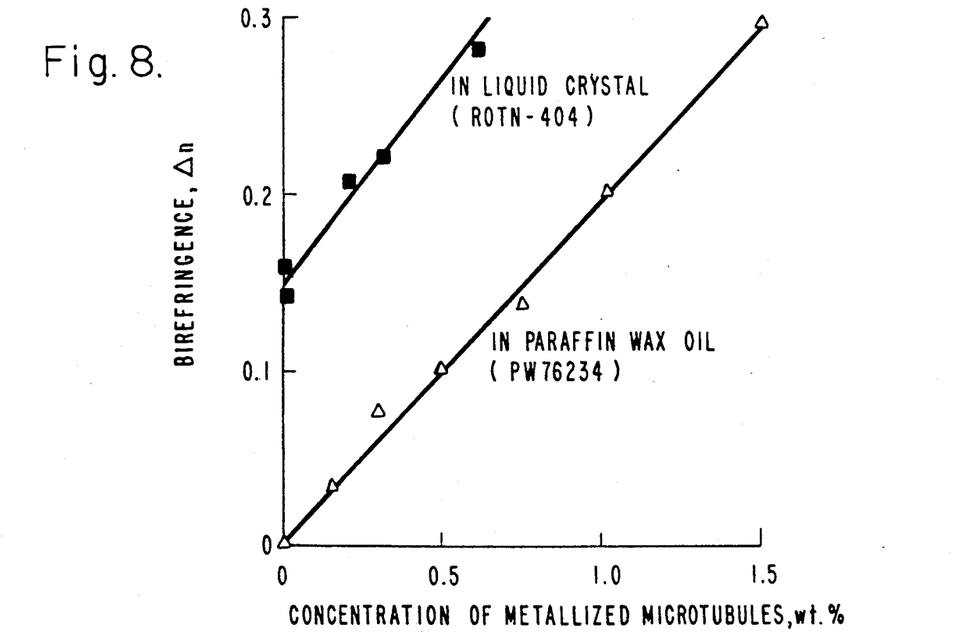
FIG. 8 is a graph of the birefringence of metallized microtubule dispersions as a function of their concentration in liquid crystal composites and in an isotropic fluid.

FIG. 8 presents a direct comparison of the birefringence as a function of concentration of the same nickel-coated microtubules in the ROTN-404 liquid crystal (data from FIG. 7) and in paraffin wax oil. The liquid crystal composites have a much higher birefringence than the isotropic composites. Also, the birefringence increases more rapidly with concentration of these metal particles in the liquid crystal composites than in the isotropic composites. These results demonstrate the enhanced effect of using the metal particles in liquid crystals as compared with isotropic media.

Anisotropic conductive particles form much more stable dispersions in liquid crystals than in isotropic fluids. Long-lasting suspensions and dispersions are obtained in liquid crystals for such anisotropic particles shorter than about 5 micrometers in length. Suspensions of larger particles, such as the 10 micrometer metallized microtubes described above, are much more stable in liquid crystals but they do gradually settle out under ambient gravity although relatively little agitation is required to keep them in suspension.

Figure 9:
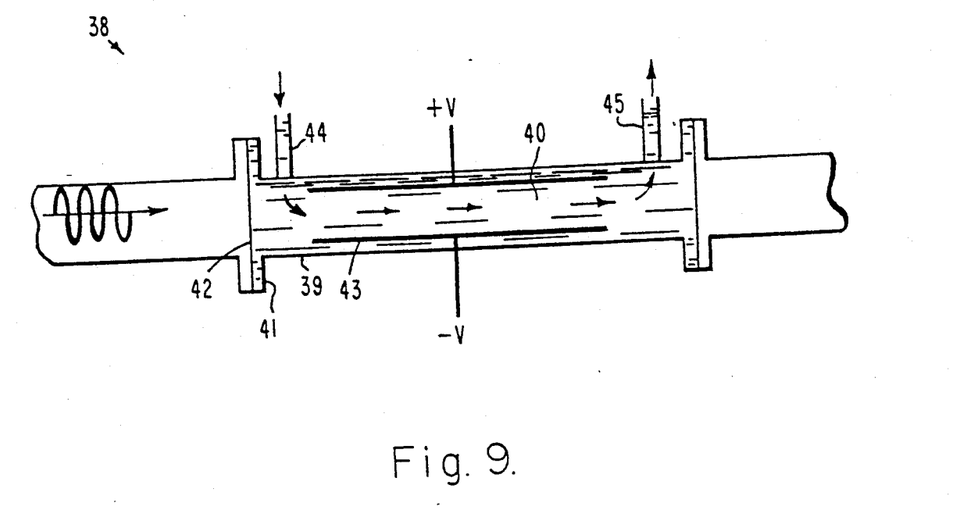
FIG. 9 is a schematic side sectional view of a microwave phase shifter using a liquid crystal composite, in which a combination of flow alignment and applied field are used for modulation.

Under uniform flow, both nematic liquid crystals and the elongated conductive particles align in the direction of flow. Thus, a flow cell waveguide modulator 38 of the type shown in FIG. 9 can be used with liquid crystal composites both to keep the conductive particles suspended and to obtain a different refractive index for the microwave travelling in the flow direction than when an orthogonal electric field is applied across this microwave modulating cell as indicated in FIG. 9.

The flow cell 38 includes a wave guide 39 defining a cavity 40 with a flange 41 at either end for joining to other lengths of waveguide. A window 42 closes each end of the cavity 40. A pair of opposing electrodes 43 are disposed on either side of the cavity 40, and another pair of electrodes or magnet pole pieces (not shown) may be placed on the opposing sides of the cavity displaced by 90 degrees with respect to the electrodes 43. A continuous flow of the mixture of microtubes and liquid crystal enters the cavity 40 through an inlet line 44 and leaves the cavity 40 through an exit line 45. The microtubes in the liquid crystal cannot settle in any substantial amount to form vertical segregation during this continuous flow.

The approach of the invention may be used in conjunction with other techniques applicable to devices. These approaches include use of polymer dispersed liquid crystals to achieve prealignment of the liquid crystal director in a direction perpendicular to the microwave electromagnetic polarization for the off-state of PDLCs with liquid crystals of positive dielectric anisotropy, and use of high applied electric fields in the 1-20 kilovolt per centimeter range by having higher applied voltages and/or multilayer electrodes within the waveguide cell to provide smaller spacings between electrodes.

Figure 10:
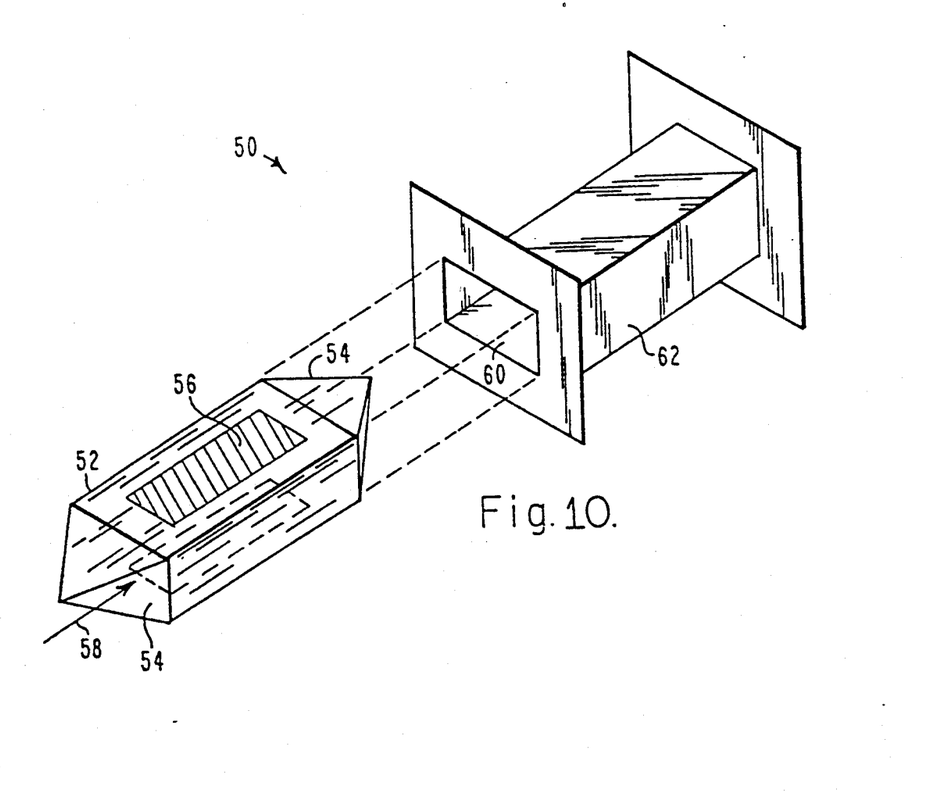
FIG. 10 is a perspective view of a cell utilizing a polymer dispersed liquid crystal phase modulating medium.

A preferred form of a cell 50 using a polymer dispersed liquid crystal microwave phase modulating medium 52 is illustrated in disassembled form in FIG. 10. The medium 52 is a free-standing piece of the polymer dispersed liquid crystal (PDLC) material. The PDLC material is prepared as described in U.S. Pat. Nos. 4,688,900 or 4,435,047, whose disclosures are incorporated by reference, except that the conventional liquid crystal material is replaced by a mixture of microtubes and liquid crystal as described herein. Ends 54 through which the microwave wave enters and leaves the medium 52 are angled. Two oppositely disposed electrode plates 56 are attached directly to the lateral sides of the medium 52, such that the electric field vector is perpendicular to the wave path 58. The electrode plates 56 function in precisely the same manner as the electrodes 26 discussed previously. Optionally, a second set of electrode plates, or magnetic pole pieces, may be provided on the other oppositely disposed lateral faces.

The entire medium 52 is assembled, and slid lengthwise into a cavity 60 of a conventional length of microwave wave guide 62 to form the cell 50. The wave guide is available commercially and is generally as described previously. This cell 50 is then bolted into a longer waveguide or used as a component of an array, or as otherwise might be needed. The medium 52 may also be readily used without a separate wave guide, as, for example, part of a large array of separately controllable media in an antenna or other device.

The field strength in the mixture of microtubes and liquid crystal transverse to the wave path in volts per unit length is an important factor in determining response time of the microwave phase modulating cell. Even for fairly small microwave wave guides of less than one centimeter internal size, the applied voltage must be quite high to attain a large field strength.

Figure 11:
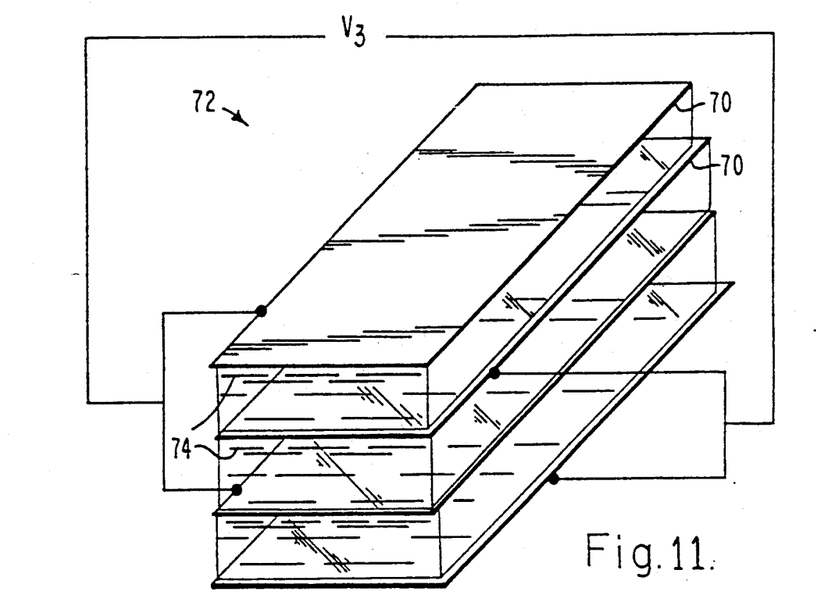
FIG. 11 is a perspective view of a layered liquid crystal waveguide phase modulator.

An approach to increasing the field strength and reducing the response time is illustrated in FIG. 11. Instead of utilizing a single pair of opposing electric field electrodes located on the opposing sides of the liquid crystal medium, a plurality of pairs of opposing electrodes 70 are provided as part of a medium 72. The electrodes 70 are arranged as a series of plates in an interdigitated form, with alternating plates being oppositely charged relative to some intermediate value by connection to a voltage source $V_3$. The electrodes are preferably prepared on thin dielectric substrates such as glass or polyester films, covered with a conductive metal coating such as aluminum. The electrodes 70 are spaced closely together. Even with a modest applied voltage $V_3$ that is readily produced with an inexpensive power supply, the electric field strength of the field between the electrodes is very large due to the small denominator in the definition of field strength, volts divided by electrode spacing.

A thin layer 74 of liquid crystal is sandwiched between each pair of electrodes 70, to complete the medium 72. The liquid crystal material can be in unconstrained liquid form, or in an encapsulated form such as a polymer dispersed liquid crystal. In the former case, the edges of the medium 72 may be sealed with a polymer adhesive to prevent loss of liquid crystal, or the entire medium 72 may be placed inside a wave guide that is in turn sealed.

Figure 12:
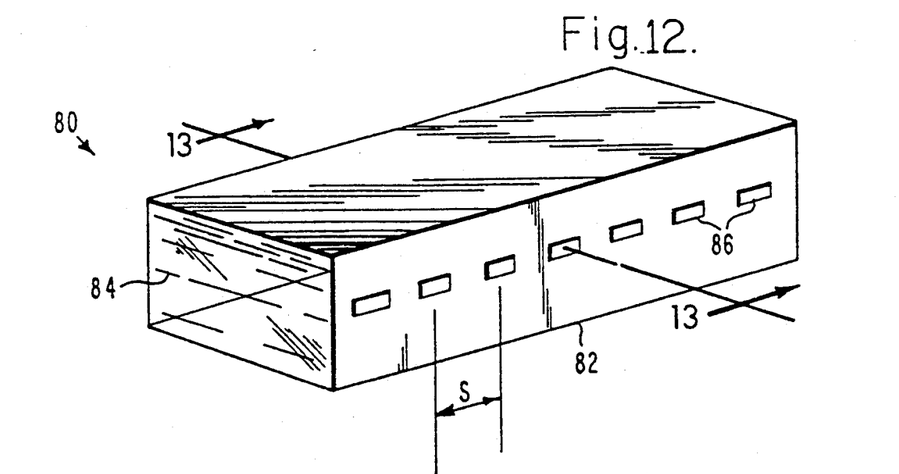
FIG. 12 is a perspective view of a liquid crystal tunable slot array antenna.
Figure 13:
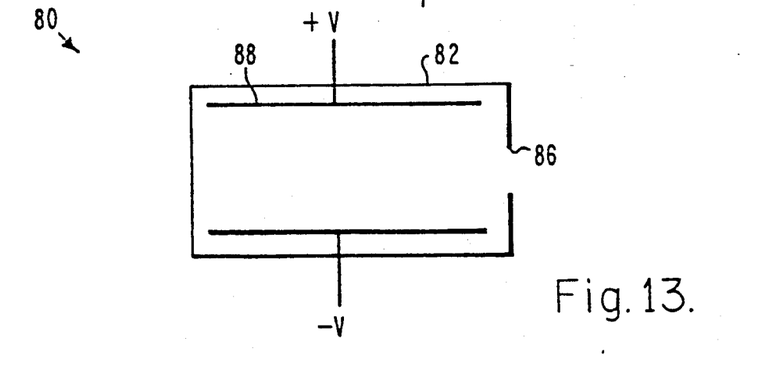
FIG. 13 is a sectional view of the slot array antenna of FIG. 12, taken along line 13—13.

The microwave modulating materials and cells of the invention may be used either singly or in arrays, and an example of each is presented by way of example and not of limitation. FIGS. 12 and 13 illustrate a tunable slot array antenna 80 having a wave guide 82 with a liquid crystal composite medium 84 therein. There are lateral openings or slots 86 in the sides of the wave guide 82. The slot array antenna 80 operates according to the principles of the antenna disclosed in U.S. Pat. No. 4,613,869, which disclosure is incorporated by reference. However, instead of an expensive ferrite tunable core, the less expensive microtube/liquid crystal mixture 84 of the invention is used. To avoid leakage, either the slots 86 in the wave guide 82 are sealed with Mylar or a similar window material, or the liquid crystal is furnished in an encapsulated form such as the polymer dispersed liquid crystal discussed previously. Electrodes 88 are placed in apertures on the sides of the wave guide 80, as shown in FIG. 13. An orthogonal magnetic field can be applied externally.

The beam direction A of a slot array antenna is governed by the relation $$1/lg - \cos A = 1/s,$$

where l is the wavelength of the microwave in free space, l g is the wavelength of the microwave in the wave guide, and s is the center-to-center spacing between the slots or openings 86. The application of a voltage to the electrodes 88 alters the orientation of the microtubes and the molecules in the liquid crystal, which in turn interact with the microwave to modify its wavelength in the wave guide l g. The angle A that satisfies the relation changes, thereby permitting the direction of the antenna to be changed by controlling the voltage applied to the electrodes 88.

Figure 14:
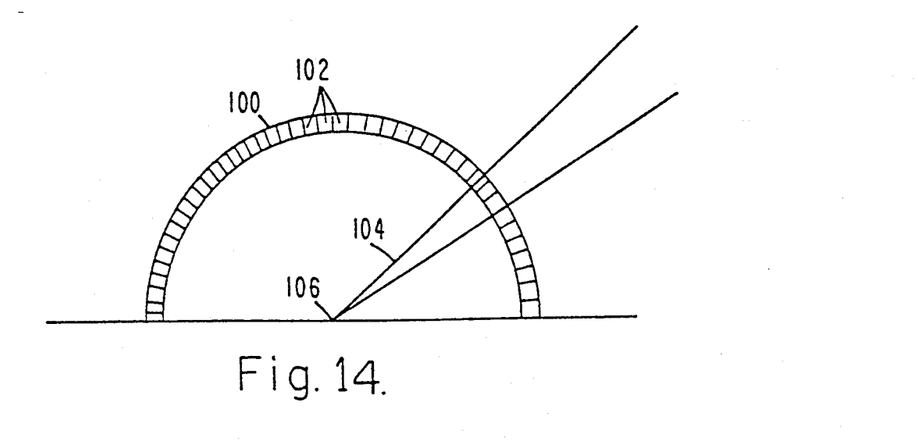
FIG. 14 is a side sectional view of a radome, without beam steering.
Figure 15:
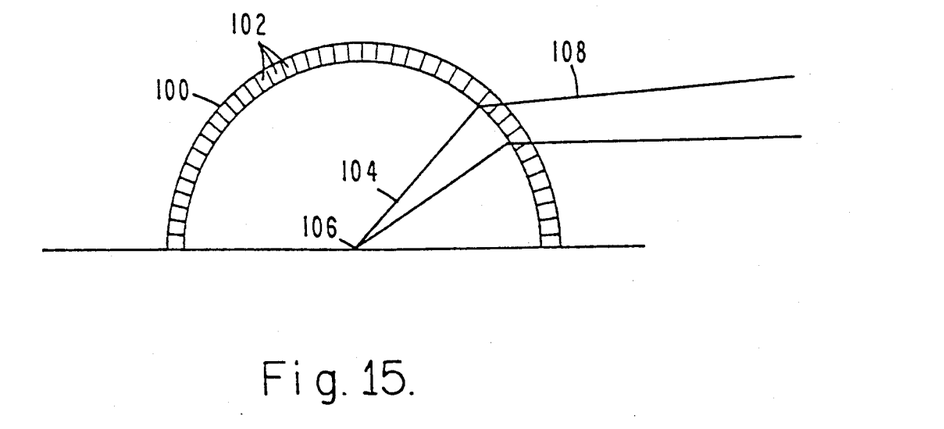
FIG. 15 is a side sectional view of a radome, with beam steering.

FIGS. 14 and 15 illustrate an array of microwave phase modulating cells that controls the sweeping of a radome 100. A plurality of individually controllable cells 102, each containing the microtube/liquid crystal composite material, is arranged in a locus, which may be flat, semicircular, or otherwise curved. A microwave beam 104 is directed outwardly from a source 106. When the radome cells 102 are not operating, FIG. 14, the beam passes through the radome 100 in a diffuse form. When the radome cells 102 are operating, FIG. 15, each is individually controlled to deflect the impinging portion of the beam 104 by an amount appropriate to form a deflected beam 108 that is aimed at some preselected location. If the radome 100 moves as a unit, the cells 102 may be programmed to keep the deflected beam 108 aimed at the preselected location. For example, if the radome is on a ship that rolls from side to side, the voltages applied to the cells 102 may be varied based upon a measurement of the roll and under control of a microprocessor to maintain the beam 108 aimed at the preselected location. While such an aimable radome antenna was possible with prior phase modulating systems, those systems were prohibitively expensive or did not have the stability required to ensure predictable operation.

Figure 16:
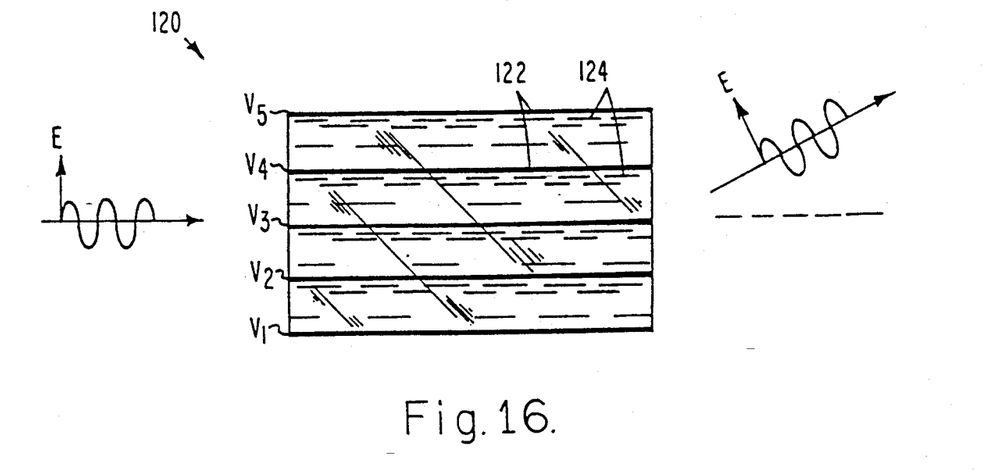
FIG. 16 is a side schematic view of a liquid crystal microwave spatial phase modulator.

A two-dimensional microwave beam steering spatial phase modulator 120 can be constructed based upon the external electric field modulation of the effective refractive index of the microtube/liquid crystal composite material. A series of parallel thin metal electrode plates 122 are stacked with narrow spacings between them. The spacings are filled with a composite liquid crystal media 124, as in FIG. 16. By activating the electrodes with predetermined electrode potentials $V_1$, $V_2$, $V_3$, $V_4$, $V_5$, the wave front of a microwave propagating in the plane of the electrodes 122 can be reshaped and hence the microwave beam direction changed. The P vector of the microwave should be perpendicular to the plane of the electrodes. In order to take advantage of the surface alignment effect of the liquid crystal, the spacing between the electrodes 122 should be on the order of 100 micrometers or less. In this configuration, the angular deflection of the beam is proportional to the applied field strength.

Figure 17:
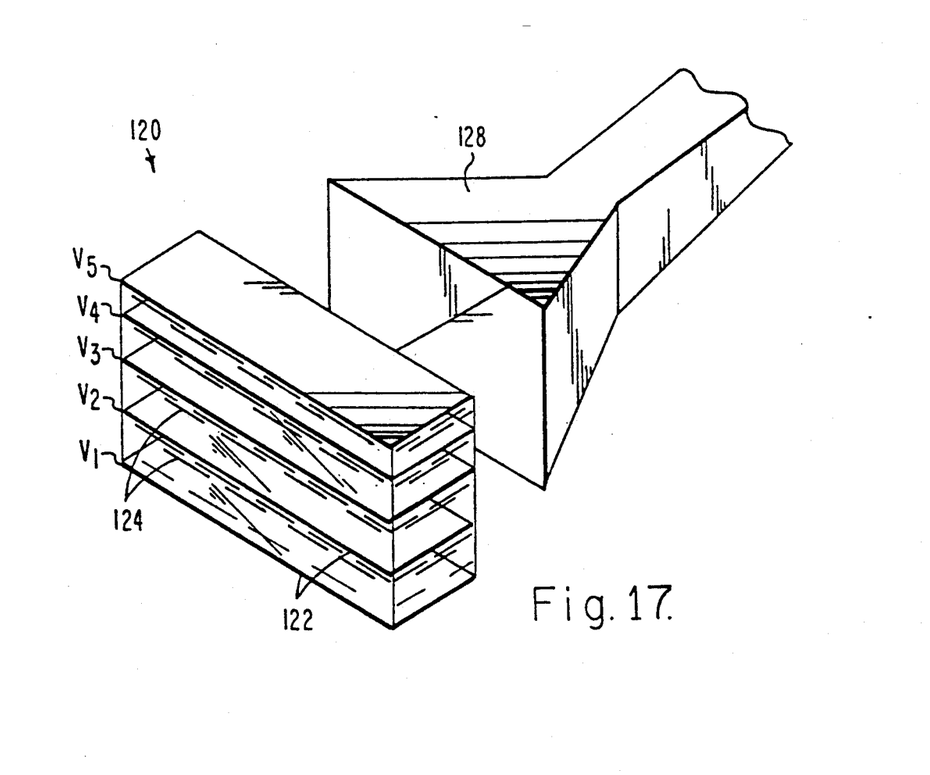
FIG. 17 is a schematic perspective view of a phase modulator used with a horn antenna.

The microwave beam modulator 120 is typically used to steer a beam radiated from a horn or any other radiating antenna. FIG. 17 shows an example of its application for a horn antenna 128. The modulator 120 is placed in front or inside the flare of the horn of the antenna 128, with the plane of the electrodes 122 perpendicular to the electric field vector of the radiating beam. On activating the electrodes 122, the radiating beam will be deflected in the plane that contains the electric field vector.

The composite material of the invention thus provides an important advance in the art of microwave devices. Although particular embodiments of the invention have been described in detail for purposes of illustration, various modifications may be made without departing from the spirit and scope of the invention. Accordingly, the invention is not to be limited except as by the appended claims.

What is claimed is:

1. A microwave phase modulating cell, comprising:
   a microwave wave guide;
   a phase modulating medium disposed within the wave guide, the phase modulating medium comprising a liquid crystal having a dispersion of electrically conducting, elongated particles therein; and
   means for controllably aligning the particles and the liquid crystal in a first direction in the phase modulating medium, wherein the means for controllably aligning aligns the particles with the liquid crystal when the particles and liquid crystals are aligned in the first direction.

2. The cell of the claim 1, further including:
   second means for controllably aligning the particles and the liquid crystal in a second direction in the phase modulating medium.

3. A liquid crystal-based composite material comprising a liquid having a dispersion of electrically conducting, elongated particles therein, wherein the elongated particles are formed of an electrically conducting metal-coated nonmetal.

4. The composite material of claim 3, wherein the composite material further comprises a body of a microwave-transparent material having droplets of the liquid crystal with the dispersion of particles therein.

5. The composite material of claim 3, wherein the microwave birefringence of the composite material is greater than that of either the liquid crystal or the particles and greater than the sum of the birefringences thereof.

6. A liquid crystal-based composite material comprising a liquid crystal having a dispersion of electrically conducting, elongated particles therein, wherein the particles are nickel-coated elongated nonmetallic tubes.

7. A liquid crystal-based composite material comprising a liquid crystal having a dispersion of electrically conducting, elongated particles therein, wherein the particles are nonmetallic tubes coated with an electrically conducting ferromagnetic material.

8. A phase modulating composite material having enhanced birefringence and being responsive to electric fields or magnetic fields applied thereto, comprising:
   liquid crystal material; and
   electrically-conducting, elongated particles dispersed in the liquid crystal material,
   wherein the elongated particles are alignable parallel with the liquid crystal material in response to the applied fields in a direction which is at a variably-controlled angle to propagation directions of microwaves or millimeter waves to be phase modulated.

9. The composite material of claim 8, wherein the liquid crystal is selected from the group consisting of a nematic liquid crystal, a cholesteric liquid crystal, and a smectic liquid crystal.

10. The composite material of claim 8, wherein the particles are both electrically conductive and ferromagnetic.

11. The composite material of claim 8, wherein the liquid crystal is a nematic liquid crystal.

12. The composite material of claim 8, wherein the enhanced birefringence is greater than the sum of the birefringence of the liquid crystal material and the birefringence of the particles.

13. The composite material of claim 8, wherein the elongated particles are formed of an electrically conducting material selected from the group consisting of a metal and a metal-coated nonmetal.

14. A method for modulating the phase of a microwave, comprising the steps of:
   providing a microwave phase modulating cell comprising:
      a phase modulating medium, the phase modulating medium comprising a liquid crystal having a dispersion of electrically conducting, elongated particles therein, and
      means for controllably aligning the particles and the liquid crystal in a selected direction in the phase modulating medium;
   directing a beam of microwave energy through the cell in a microwave propagation direction; and
   controllably aligning the particles and the liquid crystal in the selected direction, which includes aligning the particles with the liquid crystal, thereby changing the microwave index of refraction of the phase modulating medium.

15. The method of claim 14, wherein in the step of aligning, the particles and liquid crystal are aligned in the selected direction perpendicular to the microwave propagation direction.

16. The method of claim 14, wherein the means for controllably aligning comprises:
   a first alignment means for aligning the particles and liquid crystal with said first alignment means; and
   a second alignment means for aligning the particles and liquid crystal with said second alignment means; and wherein
   the step of aligning the particles and liquid crystal further includes aligning the particles and liquid crystal with the first alignment means and in the selected direction perpendicular to said microwave propagation direction.

17. The method of claim 16, wherein the step of controllably aligning further includes
   discontinuing the alignment of the particles and the liquid crystal with the first alignment means; and
   aligning the particles and the liquid crystal with the second alignment means.

18. The method of claim 16, wherein in the step of controllably aligning the particles and the liquid crystal, the first alignment means includes an electric field applied across a pair of oppositely disposed electrodes to align the particles and liquid crystal with the electric field.

19. The method of claim 16, wherein the particles are magnetic and in the step of controllably aligning the particles and the liquid crystal, the second alignment means includes a magnetic field applied across a pair of oppositely disposed pole pieces of a magnet to align said particles and liquid crystal with the magnetic field.

* * * * *